United States Patent [19]
Tokuno

[11] Patent Number: 5,565,704
[45] Date of Patent: Oct. 15, 1996

[54] MEMORY CARD HAVING TWO TYPES OF MEMORY INTEGRATED CIRCUITS CONNECTED TO TWO DIFFERENT SHAPED CONNECTORS

[75] Inventor: Kenichi Tokuno, Tokyo, Japan

[73] Assignee: NEC Corporation, Tokyo, Japan

[21] Appl. No.: 353,371

[22] Filed: Dec. 2, 1994

Related U.S. Application Data

[63] Continuation of Ser. No. 21,688, Feb. 24, 1993, abandoned.

[30] Foreign Application Priority Data

Mar. 4, 1992 [JP] Japan .................................. 4-046495

[51] Int. Cl.⁶ .............................. H01L 23/02; H01L 23/58
[52] U.S. Cl. .......................... 257/678; 257/679; 257/798
[58] Field of Search ..................... 257/678, 679, 257/680, 681, 798; 235/490, 491, 492; 361/684, 685, 686, 736, 737, 739, 748, 749, 760; 395/401, 427, 474, 497.01, 842; 365/78, 208, 94, 212, 244; 371/21.1

[56] References Cited

U.S. PATENT DOCUMENTS

| | | | |
|---|---|---|---|
| 4,532,419 | 7/1985 | Takeda | 257/679 |
| 4,980,856 | 12/1990 | Ueno | 361/684 |
| 5,274,570 | 12/1993 | Izumi et al. | 361/684 |

*Primary Examiner*—Sara W. Crane
*Assistant Examiner*—Carl Whitehead, Jr.
*Attorney, Agent, or Firm*—Whitham, Curtis, Whitham & McGinn

[57] ABSTRACT

A memory card includes two types of memory integrated circuits (ICs) and two connectors located on opposite sides of the card. One connector is electrically connected to one type of memory ICs, and the other connector is electrically connected to the other type of memory ICs. This allows two kinds of functions to coexist within a single memory card. The two types of memory ICs are a dynamic random access memory (DRAM) IC and a read-only memory (ROM) IC, respectively.

19 Claims, 2 Drawing Sheets

5,565,704

MEMORY CARD HAVING TWO TYPES OF MEMORY INTEGRATED CIRCUITS CONNECTED TO TWO DIFFERENT SHAPED CONNECTORS

This is a continuation of application Ser. No. 08/021,688 filed Feb. 24, 1993, now abandoned.

FIELD OF THE INVENTION

The present invention relates to a memory card and, in particular, to a memory card having connectors for allowing the card to be linked to an external circuit.

BACKGROUND OF THE INVENTION

In recent years, as the data processing apparatus such as a personal computer is made smaller in size, a small-size and lightweight device for storing data such as a memory card has been widely used. A memory card incorporates memory integrated circuits (hereinafter referred to merely as memory ICs) and is comprised of a connector which allows the memory IC to be electrically connected to the external circuit. Thus the memory card has features that it is not only small in size and great in capacity, but also is easy to replace.

A specific example of a conventional memory card is illustrated in FIG. 1. A plurality of memory ICs, each being indicated by the reference numeral 1, are mounted on a circuit board 2. A connector 3 is provided on one side of the circuit board 2 to make an electrical connection between the memory ICs and the external circuit (not shown). Generally, the number of the pins and the shape of the connector 3 are defined in a certain specification such as the JEIDA (Japan Electronic Industry Development Association) specification.

The circuit board 2 is fixed by means of a frame 4 and a panel sheet 5 is mounted on the frame 4.

However, since the number of the pins and the shape of the connector 3 are fixed, even if one tries to expand the function of the memory card, there is a limit imposed on it. Further, if the shape or type of the connector of an external system to be linked is different from that of the connector 3, then the memory card cannot be used. In other words, the conventional memory card has been insufficient to increase its functions or performance and its versatility.

SUMMARY OF THE INVENTION

A memory card according to the present invention is comprised of a first and a second connectors provided corresponding to a first and a second sides of the card for providing electrical connection between the internal circuit comprising a plurality of memory ICs and the external circuit. When these connectors are formed to have the different number of the pins or the different shape, the function and the versatility as a memory card can be increased.

For example, if two kinds of memory ICs are mounted within the card and are connected to the first and second connectors, respectively, then it is possible to achieve two kinds of functions for a single memory card. Preferably, the two kinds of memory ICs are DRAM (Dynamic Random Access Memory) and ROM (Read Only Memory).

DETAILED DESCRIPTION OF THE PREFERRED EMBODIMENTS

Figure 1:
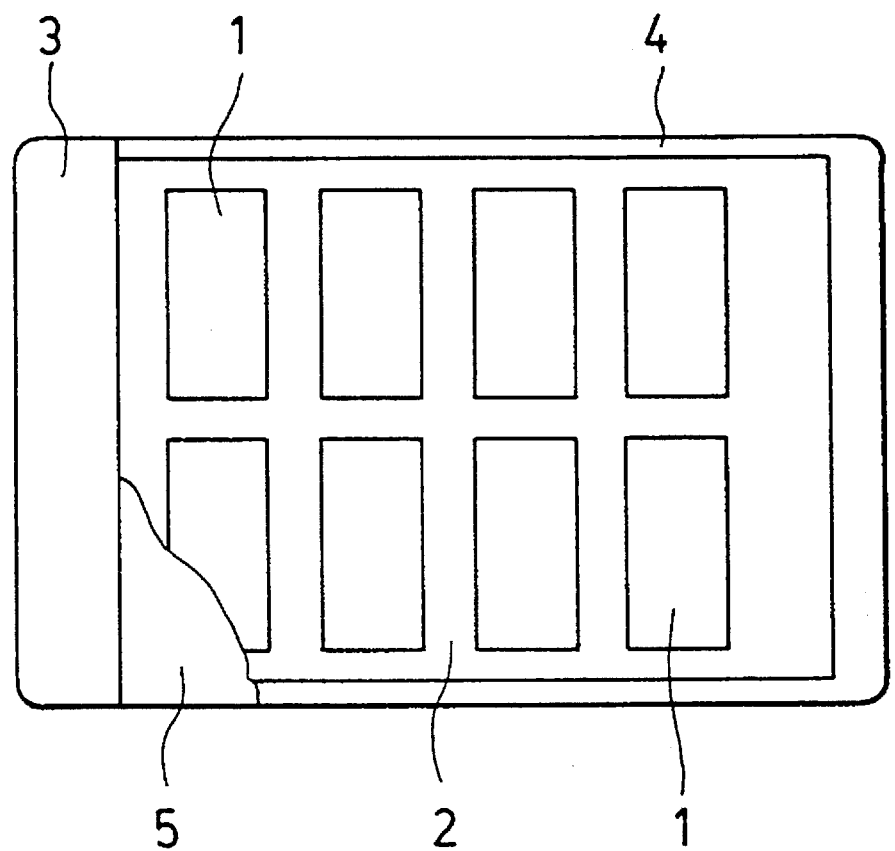
FIG. 1 is a plan view, partly broken away to show the internal circuit, of an example of a conventional memory card.
Figure 2:
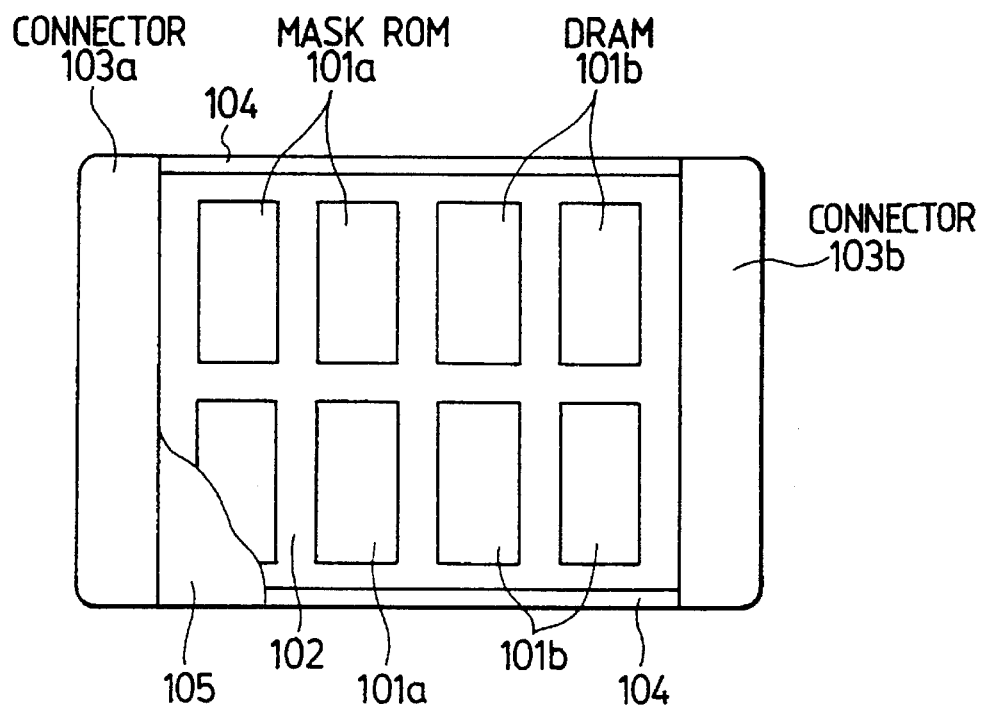
FIG. 2 is a plan view, partly broken away to show the internal circuit, of a first embodiment of a memory card of the present invention.

Referring to FIG. 2, a memory card constructed in accordance with one embodiment of the present invention incorporates a plurality of memory ICs comprising two kinds of memories: masked ROM 101a and DRAM 101b. These memory ICs are mounted on a circuit board 102.

Two connectors 103a and 103b are provided respectively on opposite sides of the circuit board 102 to provide electrical connection between the memory ICs and the external circuit. The connector 103a is connected to the masked ROMs 101a, and the connector 103b to the DRAMs 101b. According to the JEIDA specification, the connector 103a for the ROM comprises 68 pins, and the connector 103b for the DRAM comprises 88 pins, but these connectors are both of the pin inserted type.

The circuit board 102 is surrounded and fixed by a frame 104 made of resin which is formed by injection molding. On the frame 104, a panel sheet 105 made of a metal is put by means of an adhesion sheet or the like. The panel sheet 105 in FIG. 2 is partly broken for the sake of showing the internal configuration.

Such a memory card can be used as a ROM card by using the connector 103a and/or as a DRAM card by using the connector 103b. In other words, a single memory card can provide two kinds of memory areas coexisting therein, the memory areas comprising, for example, one for storing software and the other for writing data. This can increase its functions or performance and its versatility as compared with that of the conventional memory card.

Incidentally, the kind of the memory is not necessarily restricted to masked ROMs or DRAMs. It is apparent that it may be a combination of flash programmable ROMs and static RAMs or the like.

Figure 3:
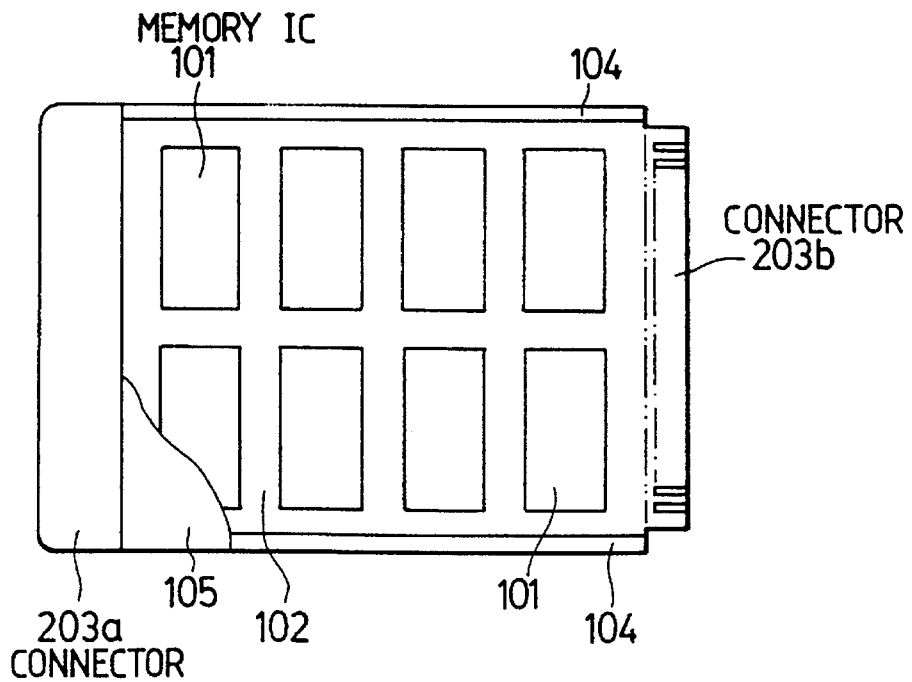
FIG. 3 is a plan view, partly broken away to show the internal circuit, of a second embodiment of the present invention.

Referring to FIG. 3, in the memory card, a plurality of memory ICs 101 are mounted on the circuit board 102, and a pin inserted type connector 203a is provided on either one of the opposed sides of the circuit board 102 and a card edge connector 203b is provided on the other. The connectors 203a and 203b are both connected to the memory ICs 101.

Such an arrangement allows the memory card to be linked to either a pin inserted type or card edge type connector into which the card is to be inserted, thus increasing the versatility of the memory card. Of course, it is not restricted to the pin inserted type and card edge type, but any two types of connectors as increasing its versatility may be employed.

It is extremely easy to those skilled in the art to contemplate a memory card having the two kinds of memories and two types of connectors by combining the memory cards shown in FIGS. 2 and 3.

What is claimed is:
1. A memory card comprising:
   a circuit board mounted within said card, said circuit board being substantially quadrilateral;
   two types of memory integrated circuits mounted on said circuit board;
   a first connector electrically connected to a first type of said two types of memory integrated circuits and dis- connected from a second type of said two types of memory integrated circuits, said first connector being located on a first side of said card; and a second connector electrically connected to said second type of memory integrated circuits and disconnected from said first type of memory integrated circuits, said Second connector being located on a second side of said card.

2. A memory card according to claim 1, wherein said first connector and said second connector both comprise one of male-type connectors and female-type connectors.

3. A memory card according to claim 1, wherein said first connector and said second connector each comprise plug in-type connectors for connecting said memory card to a main circuit board.

4. A memory card according to claim 1, wherein said first and second types of memory integrated circuits are separately connected to said first and second connectors located on first and second sides of said card, said first and second sides being opposed to one another.

5. A memory card as set forth in claim 1, wherein said first type of memory integrated circuits comprises a read-only memory, and said second type of memory integrated circuits comprises a random access memory.

6. A memory card as set forth in claim 1, wherein said first connector and said second connector differ in shape.

7. A memory card as set forth in claim 6, wherein one of said first and second connectors comprises a pin inserted-type connector and the other of said first and second connectors comprises a card edge-type connector.

8. A memory card comprising:

a circuit board mounted within said card, said circuit board being substantially quadrilateral;

two types of memory integrated circuits mounted on said circuit board;

a first connector electrically connected to a first type of said two types of memory integrated circuits and disconnected from a second type of said two types of memory integrated circuits, said first connector being located on a first side of said card; and a second connector electrically connected to said second type of memory integrated circuits and disconnected from said first type of memory integrated circuits, said second connector being located on a second side of said card, wherein said first type of memory integrated circuits comprises a read-only memory, and said second type of memory integrated circuits comprises a random access memory, wherein said first connector and said second connector differ in shape and wherein one of said first and second connectors comprises a pin inserted-type connector and the other of said first and second connectors comprises a card edge-type connector.

9. A memory card according to claim 8, wherein said first and second connectors differ in their number of pins.

10. A memory card according to claim 8, wherein said first and second types of memory integrated circuits are separately connected to said first and second connectors located on first and second sides of said card, said first and second sides being opposed to one another.

11. A memory card comprising:

a circuit board mounted within said card, said circuit board being substantially quadrilateral;

a plurality of independent memory circuits mounted on said circuit board;

a first connector electrically connected to a first independent memory circuit of said plurality of independent memory circuits, said first connector being located on a first side of said card; and a second connector electrically connected to a second independent memory circuit of said plurality of independent memory circuits, said second connector being located on a second side of said card, wherein said first connector and said second connector are for connecting said memory card to a main circuit board, wherein said first independent memory circuit comprises a plurality circuit comprises a plurality of second type memory integrated circuits.

12. A memory card according to claim 11, wherein said plurality of first type memory integrated circuits and said plurality of second type memory integrated circuits are different types of memory integrated circuits.

13. A memory card according to claim 11, wherein said plurality of first type memory integrated circuits and said plurality of second type memory integrated circuits are a similar type of memory integrated circuits.

14. A memory card according to claim 11, wherein said plurality of first type memory integrated circuits and said plurality of second type memory integrated circuits each comprise multiple types of memory integrated circuits.

15. A memory card according to claim 11, wherein said plurality of first type memory integrated circuits and said plurality of second type memory integrated circuits are read only memory integrated circuits.

16. A memory card according to claim 11, wherein said plurality of first type memory integrated circuits and said plurality of second type memory integrated circuits are random access memory integrated circuits.

17. A memory card according to claim 11, wherein said plurality of first type memory integrated circuits are read only memory integrated circuits and said plurality of second type memory integrated circuits are random access memory integrated circuits.

18. A memory card according to claim 11, wherein said plurality of first type memory integrated circuits and said plurality of second type memory integrated circuits each comprise read only memory integrated circuits and random access memory integrated circuits.

19. A memory card according to claim 11, wherein said first connector and said second connector differ in shape.

* * * * *